United States Patent
Filipovic et al.

(10) Patent No.: US 8,134,413 B2
(45) Date of Patent: Mar. 13, 2012

(54) LOW-POWER OSCILLATOR

(75) Inventors: Daniel Filipovic, San Diego, CA (US); Hongbo Yan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 12/606,357

(22) Filed: Oct. 27, 2009

(65) Prior Publication Data

US 2011/0095791 A1 Apr. 28, 2011

(51) Int. Cl.
*H03L 7/00* (2006.01)
(52) U.S. Cl. ............ 331/16; 331/34; 331/1 A; 331/167; 331/177 V; 331/117 R; 331/117 FE
(58) Field of Classification Search ............ 331/16, 331/34, 1 A, 167, 177 V, 117 R, 117 FE
See application file for complete search history.

(56) References Cited

U.S. PATENT DOCUMENTS

| | | | |
|---|---|---|---|
| 7,764,134 B2 * | 7/2010 | Fu et al. ............. | 331/74 |
| 2003/0076747 A1 | 4/2003 | Jung | |
| 2006/0045215 A1 | 3/2006 | Ballantyne et al. | |
| 2009/0086588 A1 | 4/2009 | Okamoto et al. | |

OTHER PUBLICATIONS

International Search Report and Written Opinion—PCT/US2010/054245, International Search Authority—European Patent Office—Dec. 27, 2010.

* cited by examiner

*Primary Examiner* — Arnold Kinkead
(74) *Attorney, Agent, or Firm* — Jeffrey D. Jacobs

(57) ABSTRACT

Techniques for synthesizing a signal having a desired frequency from an oscillation signal. In an aspect, a reference signal having a known frequency may be periodically used to determine a ratio between the desired frequency and the frequency of the oscillation signal. The oscillation signal may be decimated by the ratio to generate a synthesized signal having approximately the desired frequency. In an aspect, the decimation may be performed by generating a pulse in response to the output of an accumulator that accumulates in steps of the ratio. To save power, the oscillation signal may be derived from a low-power oscillator, while the reference signal may be turned on only during periodic calibration. Further aspects for improving the frequency accuracy of the synthesized signal are disclosed.

38 Claims, 13 Drawing Sheets

LOW-POWER OSCILLATOR

TECHNICAL FIELD

The disclosure relates to electronics, and more particularly, to low-power techniques for generating signals having a desired frequency.

BACKGROUND

Crystal oscillators are frequently used to generate reference clock signals for a communications system. A low-power crystal oscillator may be used in certain applications supporting clock signals having low instantaneous frequency accuracy, e.g., during a sleep mode according to wireless communications standards such as CDMA, UMTS, Bluetooth, Wireless LAN, etc. However, a low-power crystal oscillator may still be relatively expensive in terms of cost, and may also be difficult to integrate in an integrated circuit (IC) solution.

It would be desirable to provide low-power techniques for generating an oscillation signal that may be readily integrated on an IC.

SUMMARY

An aspect of the present disclosure provides a method for synthesizing a signal having a desired frequency from an oscillation signal, the method comprising: computing a ratio between the desired frequency and the frequency of the oscillation signal using a reference signal, the reference signal having a known frequency, the frequency of the oscillation signal being greater than the desired frequency; and decimating the oscillation signal according to the computed ratio to generate the synthesized signal.

Another aspect of the present disclosure provides an apparatus for synthesizing a signal having a desired frequency from an oscillation signal, the apparatus comprising: a ratio calculator for computing a ratio between the desired frequency and the frequency of the oscillation signal using a reference signal, the reference signal having a known frequency, the frequency of the oscillation signal being greater than the desired frequency; and a decimator for decimating the oscillation signal according to the computed ratio to generate the synthesized signal.

Yet another aspect of the present disclosure provides an apparatus for synthesizing a signal having a desired frequency from an oscillation signal, the apparatus comprising: means for computing a ratio between the desired frequency and the frequency of the oscillation signal; and means for decimating the oscillation signal according to the computed ratio to generate the synthesized signal.

Yet another aspect of the present disclosure provides a computer program product storing code for causing a computer to synthesize a signal having a desired frequency from an oscillation signal, the code comprising: code for causing a computer to compute a ratio between the desired frequency and the frequency of the oscillation signal using a reference signal, the reference signal having a known frequency, the frequency of the oscillation signal being greater than the desired frequency; and code for causing a computer to decimate the oscillation signal according to the computed ratio to generate the synthesized signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
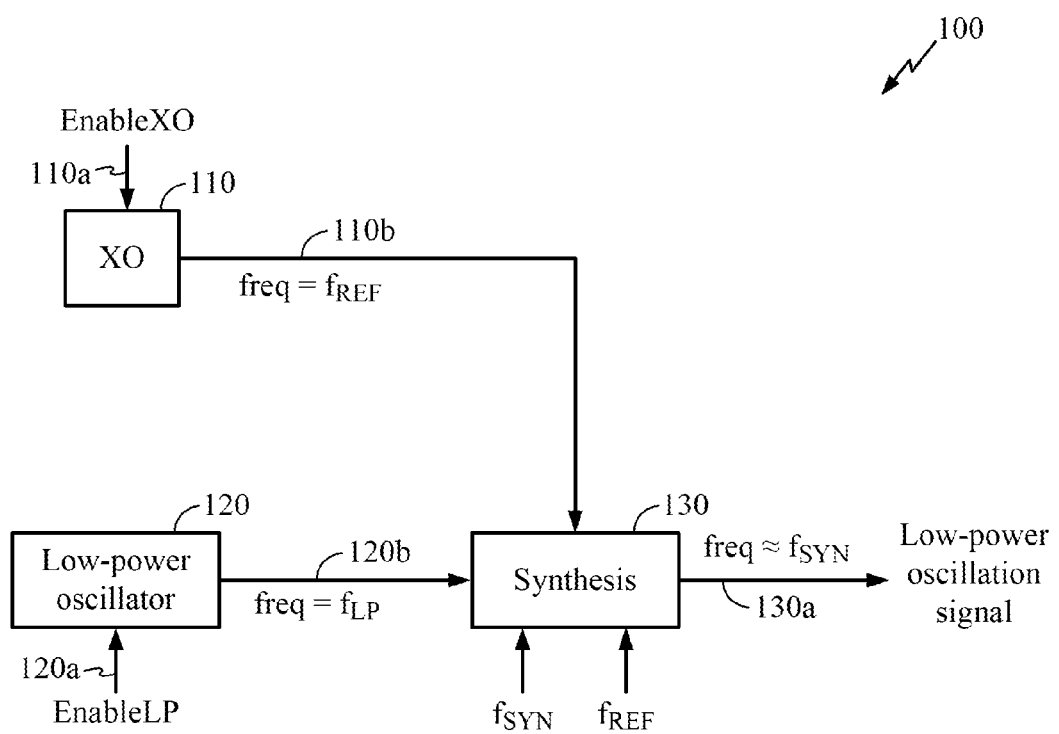
FIG. 1 illustrates an exemplary embodiment of a system for synthesizing a signal having a desired frequency from an oscillation signal according to the present disclosure.

FIG. 1 illustrates an exemplary embodiment 100 of a system for synthesizing a signal having a desired frequency from an oscillation signal according to the present disclosure.

In FIG. 1, a crystal oscillator (XO) 110 is shown for generating a reference signal 110b having frequency $f_{REF}$. The crystal oscillator 110 is turned on or off by a control signal EnableXO 110a. In an exemplary embodiment, when EnableXO 110a assumes a logical high (HI) value, the crystal oscillator 110 is turned on and generates the reference signal 110b, and when EnableXO 110a assumes a logical low value (LO), the crystal oscillator 110 is turned off and consumes little or no power.

In an exemplary embodiment, $f_{REF}$ may be 19.2 MHz. It will be appreciated that while exemplary embodiments of the present disclosure are described using a reference signal generated by a crystal oscillator (XO), alternative exemplary embodiments may employ reference signals generated by any alternative oscillation mechanisms known in the art. Such techniques are contemplated to be within the scope of the present disclosure.

Further shown in FIG. 1 is a low-power oscillator 120 for generating an oscillation signal 120b having frequency $f_{LP}$. The low-power oscillator 120 is turned on or off by a control signal EnableLP 120a. In an exemplary embodiment, when EnableLP 120a is HI, the low-power oscillator 120 is turned on and generates the oscillation signal 120b, and when EnableLP 120a is LO, the low-power oscillator 120 is turned off and consumes little or no power.

In an exemplary embodiment, the low-power oscillator 120 may be an RC oscillator well-known in the art. In an exemplary embodiment, the low-power oscillator 120 may be integrated onto an integrated circuit (IC) containing the rest of a device utilizing the low-power oscillator 120.

In an exemplary embodiment, the low-power oscillator 120 is designed to consume less power than the crystal oscillator 110 when turned on, while the frequency stability and/or frequency accuracy of the oscillation signal 120b may be less than that of the reference signal 110b.

The signals 110b and 120b are both provided to a synthesis module 130. The synthesis module 130 is configured to generate a synthesized signal 130a having frequency close to a configurable frequency $f_{SYN}$ specified to the synthesis module 130. The expected frequency $f_{REF}$ of the reference signal 110b is also specified to the synthesis module 130. In the exemplary embodiment shown, it is assumed that the expected frequency $f_{REF}$ closely approximates the actual frequency of the reference signal 110b.

In an exemplary embodiment, the synthesis module 130 periodically measures the actual frequency of the oscillation signal 120b using the reference signal 110b, and decimates the oscillation signal 120b by an appropriate factor to synthesize the signal 130a having approximately the configurable frequency $f_{SYN}$.

Figure 2:
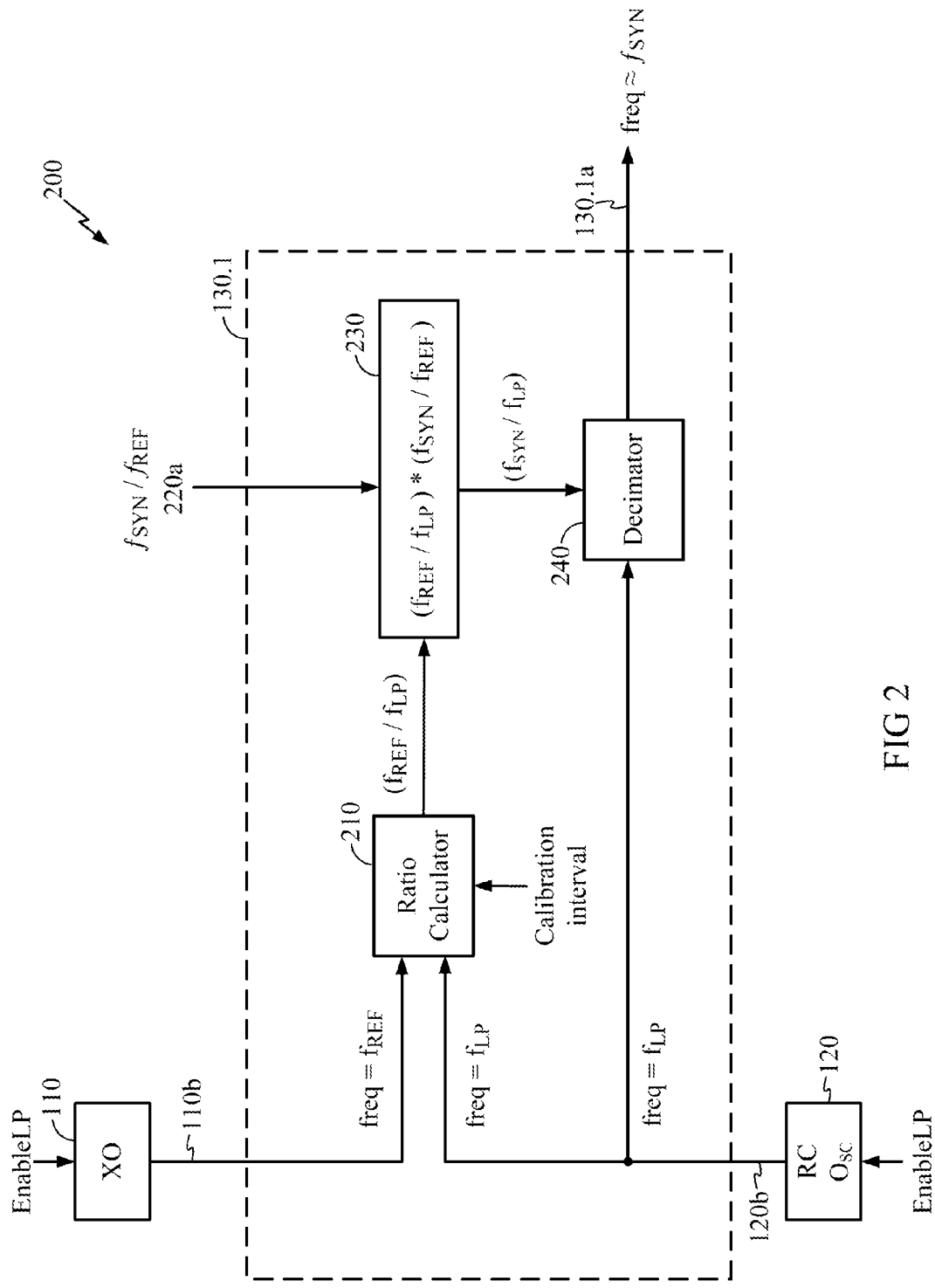
FIG. 2 illustrates an exemplary embodiment of the synthesis module in a system for generating a synthesized signal according to the present disclosure.

FIG. 2 illustrates an exemplary embodiment 130.1 of the synthesis module 130 in a system 200 for generating a synthesized signal 130.1a according to the present disclosure. Note the synthesis module 130.1 is shown for illustrative purposes only, and is not meant to limit the scope of the present disclosure to any specific implementations of a synthesis module 130 shown. One of ordinary skill in the art may readily derive alternative implementations of circuitry, logic, etc., for performing the functions described, and such alternative exemplary embodiments are contemplated to be within the scope of the present disclosure.

In FIG. 2, the synthesis module 130.1 accepts the reference signal 110b from the XO 110, and the oscillation signal 120b from the low-power oscillator 120. The signals 110b and 120b are provided to a reference ratio calculator 210 in the synthesis module 130.1. In an exemplary embodiment, the ratio calculator 210 is configured to compute the ratio ($f_{REF}/f_{LP}$) of $f_{REF}$ to $f_{LP}$ from the signals 110b and 120b. In an exemplary embodiment, the calculation of ($f_{REF}/f_{LP}$) may be performed less than continuously, e.g., periodically in time according to a calibration interval as shown, or aperiodically in time according to any predetermined criteria, such as the criteria further described hereinbelow with reference to FIG. 4B.

The computed ratio ($f_{REF}/f_{LP}$) is further provided to a synthesis ratio calculator 230, which computes a product of the computed ratio ($f_{REF}/f_{LP}$) with a pre-computed ratio ($f_{SYN}/f_{REF}$) to generate the ratio ($f_{SYN}/f_{FP}$). In an exemplary embodiment, $f_{LP}$ is chosen to be greater than $f_{SYN}$ over all likely variations in temperature, process, etc., such that $f_{SYN}/f_{FP}$ is generally expected to be less than 1. For example, $f_{SYN}$ may be chosen to be 32 kHz in an application of the present disclosure to a sleep mode clock for certain wireless communications applications, and $f_{LP}$ may vary over a range of 40-80 kHz.

One of ordinary skill in the art will appreciate that there are various ways to implement the functionality of the ratio calculator 210. For example, a counter (not shown) may be configured to count the number of cycles of the reference signal 110b elapsing in one cycle of the oscillation signal 120b. Other techniques to implement the functionality of the ratio calculator 210 will be apparent to one of ordinary skill in the art, and such alternative exemplary embodiments are contemplated to be within the scope of the present disclosure.

Furthermore, while the ratio ($f_{SYN}/f_{FP}$) is shown calculated using the combination of a ratio calculator 210 and synthesis ratio calculator 230 in FIG. 2, it will be appreciated that the ratio ($f_{SYN}/f_{LP}$) may readily be computed using alternative techniques. For example, a single module may be provided that performs the functions described using a different partitioning than shown in the exemplary embodiment 130.1 of the synthesis module 130 shown in FIG. 2. Such alternative exemplary embodiments are contemplated to be within the scope of the present disclosure.

The computed value of ($f_{SYN}/f_{LP}$) output by the synthesis ratio module 230 is supplied to a decimator 240. The decimator 240 is configured to synthesize from the oscillation signal 120b a synthesized signal 130.1a having a frequency of approximately $f_{SYN}$. In an exemplary embodiment, this may be done by decimating the oscillation signal 120b according to the computed ratio ($f_{SYN}/f_{LP}$).

Figure 3A:
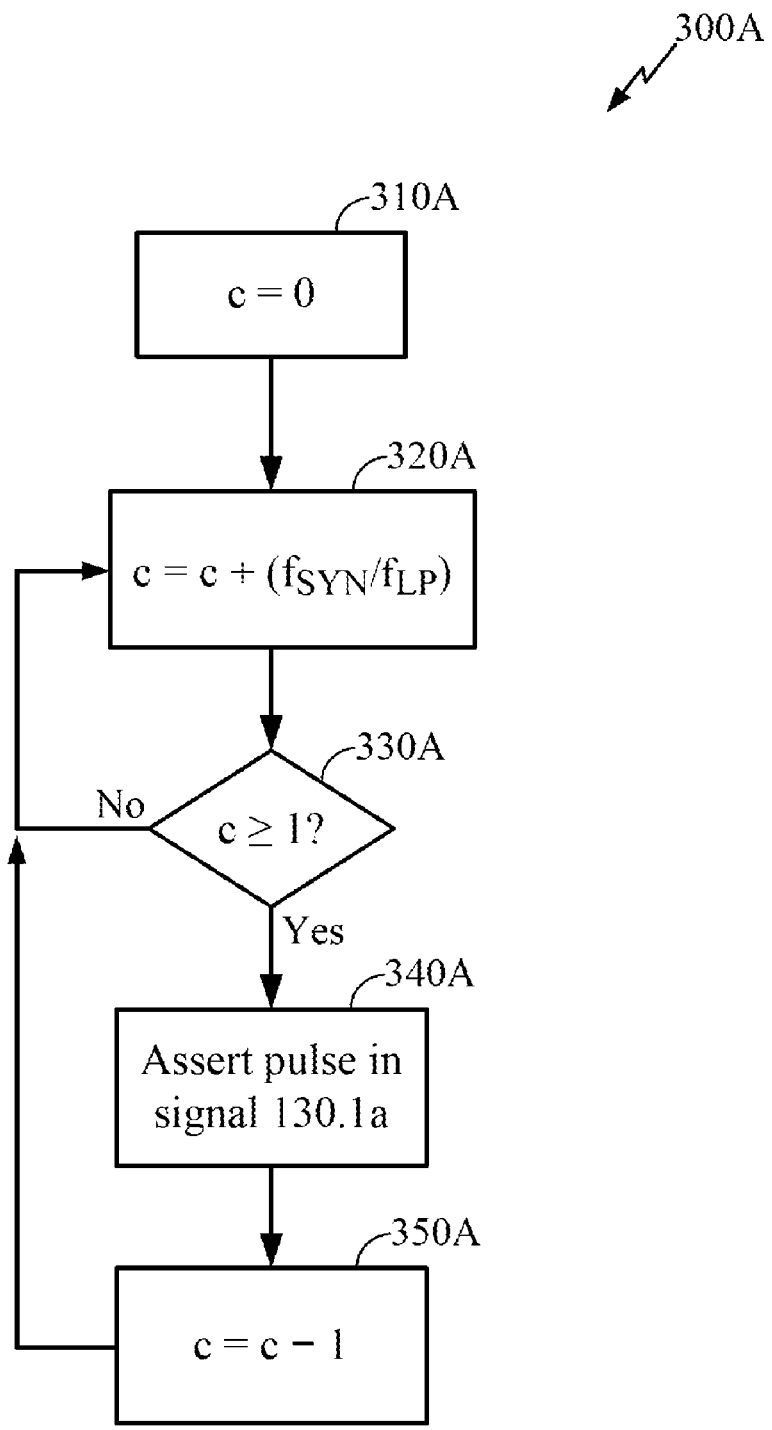
FIG. 3A illustrates an exemplary block diagram for implementing the functionality of the decimator.

FIG. 3A illustrates an exemplary block diagram 300A for implementing the functionality of the decimator 240. It will be appreciated that the exemplary block diagram 300A is shown for illustrative purposes only, and is not meant to limit the scope of the present disclosure to any particular implementations of the decimator 240. One of ordinary skill in the art may readily derive alternative circuitry, logic, etc., for performing the functionality of the decimator 240, e.g., for decimating the oscillation signal 120b according to the ratio ($f_{SYN}/f_{LP}$). Such alternative exemplary embodiments are contemplated to be within the scope of the present disclosure.

In FIG. 3A, at block 310A, a variable c is initialized to zero. c may contain both an integer and a non-integer (i.e., fractional) portion.

At block 320A, c is incremented by the value ($f_{SYN}/f_{LP}$) on a rising edge detected in the oscillation signal 120b. In an exemplary embodiment, ($f_{SYN}/f_{LP}$) may be as calculated by the ratio calculator 210, and may be less than 1.

At block 330A, it is checked whether the value of c is greater than or equal to 1. If not, then the decimator 240 returns to block 320A. If yes, then the decimator 240 proceeds to block 340A.

At block 340A, a pulse is asserted in the signal 130.1a.

At block 350A, c is decremented by 1. After block 350A, the decimator 340 returns to block 320A.

In another exemplary embodiment, blocks 320A-350A may alternatively be implemented by asserting a pulse in the signal 130.1a whenever the fractional portion of c "loops over," i.e., whenever an integer portion of c is incremented.

Other modifications may be made to the operations shown in blocks 320A-350A to achieve similar functional purposes. For example, the incrementing at block 320A may be done using any scaled versions of $(f_{SYN}/f_{LP})$, and the subsequent constants may be scaled accordingly. Furthermore, decrementing may readily be used instead of incrementing, with the appropriate modifications. Such modifications, and other modifications not explicitly described herein, will be clear to one of ordinary skill in the art, and are contemplated to be within the scope of the present disclosure.

In light of the above disclosure, one of ordinary skill in the art may further derive alternative implementations to decimate the oscillation signal 120b to generate the synthesized signal 130a. For example, a counter may be designed to count a number $(f_{LP}/f_{SYN})$ of cycles elapsing in the oscillation signal 120b and generate a pulse corresponding therewith, and to further account for the non-integral portion of $(f_{LP}/f_{SYN})$ every appropriate number of cycles. Such alternative exemplary embodiments are contemplated to be within the scope of the present disclosure.

Figure 3B:
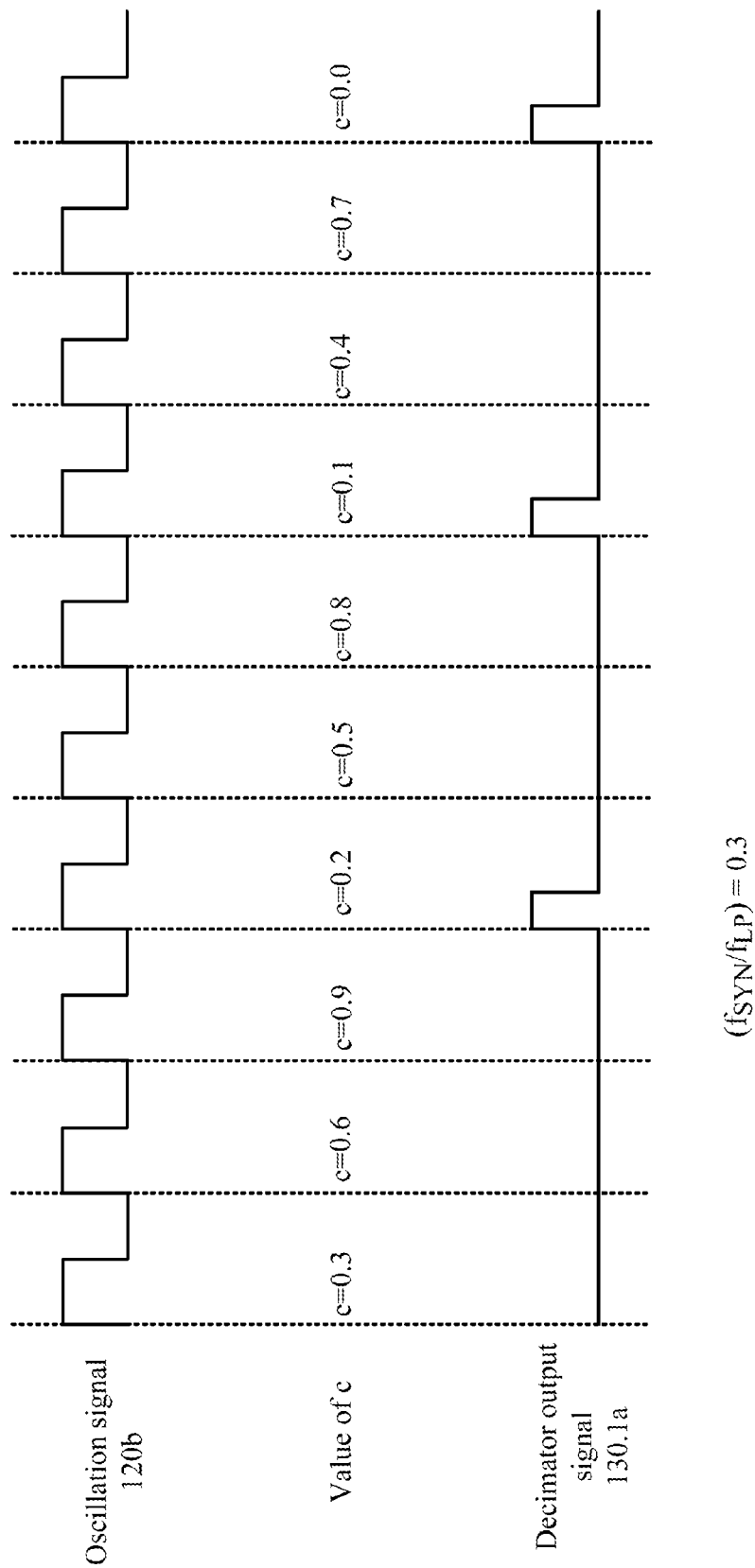
FIG. 3B illustrates a timing diagram of the exemplary embodiment of the decimator operation according to the block diagram of FIG. 3A, wherein ($f_{SYN}/f_{LP}$) is equal to 0.3 for illustrative purposes.

FIG. 3B illustrates a timing diagram of the exemplary embodiment of the decimator operation according to the block diagram of FIG. 3A, wherein $(f_{SYN}/f_{LP})$ is equal to 0.3 for illustrative purposes. In FIG. 3B, a portion of the signal 130.1a and the variable c are shown starting with the variable c equal to 0.3, for illustrative purposes. c is seen to be incremented by $(f_{SYN}/f_{LP})$=0.3 on every rising edge of the oscillation signal 120b. As described with reference to blocks 330A-350A of FIG. 3A, whenever c equals to or exceeds 1, a pulse is asserted in the decimator output signal 130.1a, and c is decremented by 1. Note the timing diagram in FIG. 3B is shown for illustrative purposes only, and is not meant to limit the scope of the present disclosure to any particular values for the parameters shown.

In light of FIG. 3B, it will be appreciated that assuming the frequency of the oscillation signal 120b is relatively constant over a time interval T, the decimator output signal 130.1a will generate on average $f_{SYN}*T$ pulses over T. While the instantaneous frequency of the decimator output signal 130.1a may vary over T, such variance may be acceptable for certain applications supporting clocks having low instantaneous frequency accuracy, e.g., during a sleep mode according to certain wireless communications standards as previously mentioned herein. For example, in such a "sleep mode," to save power, a communications device may temporarily be put into a state of reduced activity and lower power consumption for a predetermined period of time, wherein the predetermined period of time may be measured using a clock signal such as the signal 130.1a. Upon awakening from the sleep mode, the device may, e.g., resume normal operation at normal power consumption levels.

Figure 3C:
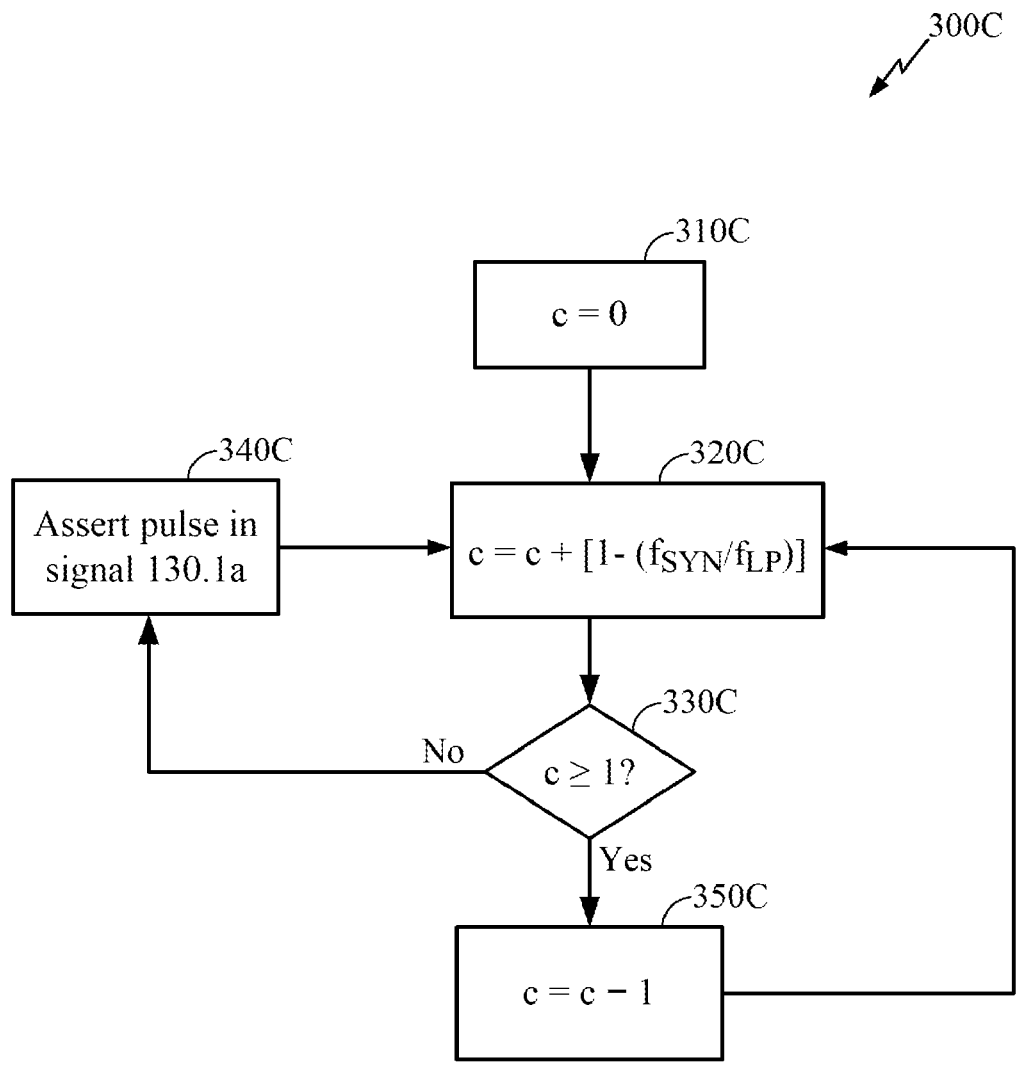
FIG. 3C illustrates an alternative exemplary block diagram for implementing the functionality of the decimator.

FIG. 3C illustrates an alternative exemplary block diagram 300C for implementing the functionality of the decimator 240. It will be appreciated that the exemplary block diagram 300C is shown for illustrative purposes only, and is not meant to limit the scope of the present disclosure to any particular implementations of the decimator 240. One of ordinary skill in the art may readily derive alternative circuitry, logic, etc., for performing the functionality of the decimator 240, e.g., for decimating the oscillation signal 120b according to the ratio $(f_{SYN}/f_{LP})$. Such alternative exemplary embodiments are contemplated to be within the scope of the present disclosure.

In FIG. 3C, at block 310C, a variable c is initialized to zero. c may contain both an integer and a non-integer (i.e., fractional) portion.

At block 320C, c is incremented by the value $1-(f_{SYN}/f_{LP})$ on a rising edge detected in the oscillation signal 120b. In an exemplary embodiment, $(f_{SYN}/f_{LP})$ may be as calculated by the ratio calculator 210, and may be less than 1.

At block 330C, it is checked whether the value of c is greater than or equal to 1. If not, then the block diagram 300C proceeds to block 340C. If yes, then the block diagram 300C proceeds to block 350C.

At block 340C, a pulse is asserted in the signal 130.1a, and the block diagram 300C returns to block 320C. In an exemplary embodiment, the pulse asserted in the signal 130.1a may be simply a pulse of the oscillation signal 120b "passed through" by the decimator 240.

At block 350C, c is decremented by 1, and the block diagram 300C returns to block 320C. No pulse is asserted in the signal 130.1a at block 350C. In an exemplary embodiment, the operation at block 350C may also include the decimator 240 "blocking" or "swallowing" a pulse of the oscillation signal 120b, such that no pulse is asserted in the signal 130.1a.

Figure 3D:
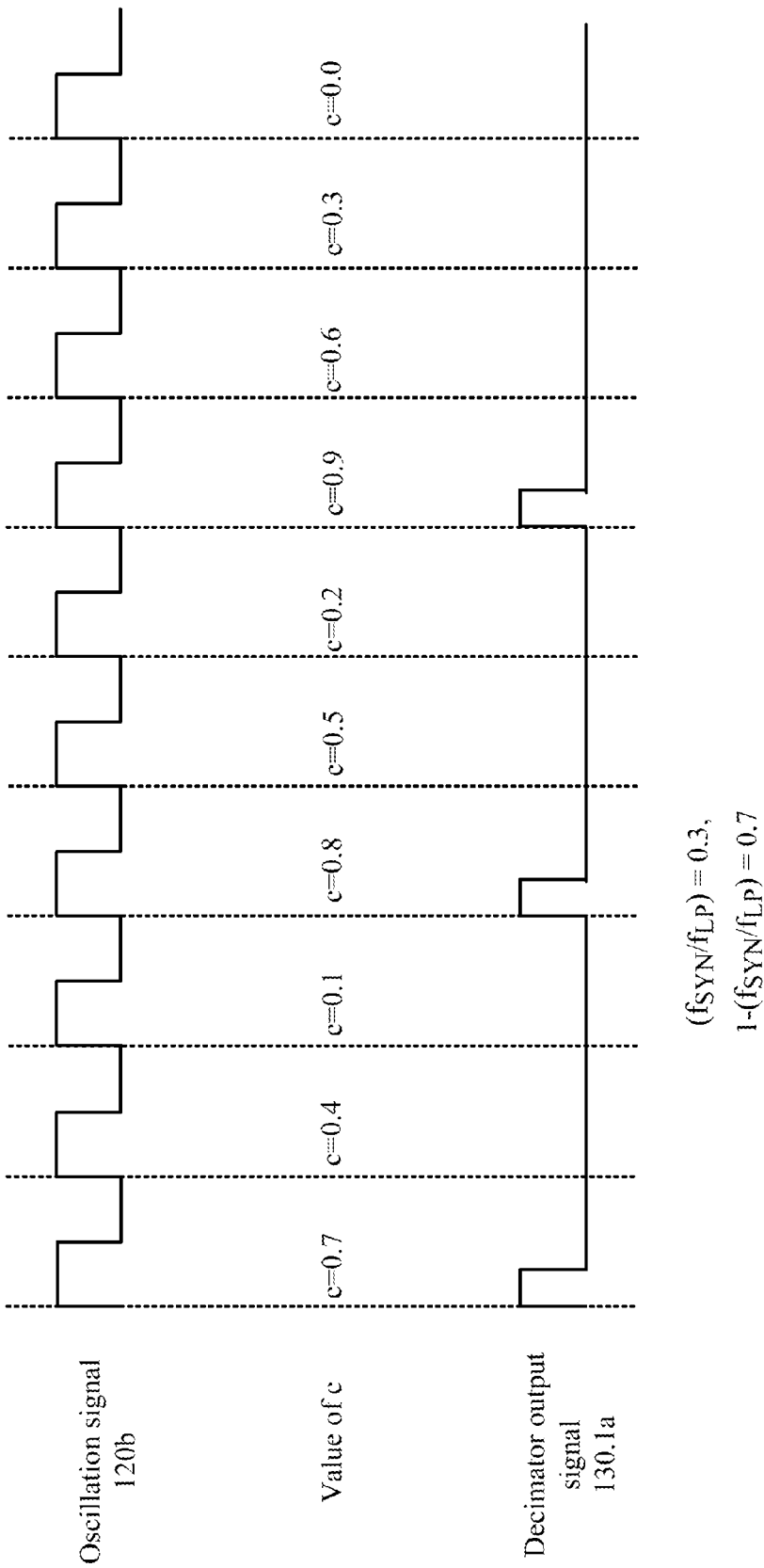
FIG. 3D illustrates a timing diagram of the exemplary embodiment of the decimator operation according to the block diagram of FIG. 3C, wherein ($f_{SYN}/f_{LP}$) is equal to 0.3, and thus $1-(f_{SYN}/f_{LP})$ is equal to 0.7, for illustrative purposes.

FIG. 3D illustrates a timing diagram of the exemplary embodiment of the decimator operation according to the block diagram of FIG. 3C, wherein $(f_{SYN}/f_{LP})$ is equal to 0.3, and thus $1-(f_{SYN}/f_{LP})$ is equal to 0.7, for illustrative purposes. In FIG. 3D, c is seen to be incremented by $1-(f_{SYN}/f_{LP})$=0.7 on every rising edge of the oscillation signal 120b. As described with reference to blocks 330C-350C of FIG. 3C, as long as c does not equal to or exceed 1, a pulse is asserted in the decimator output signal 130.1a. If c equals to or exceeds 1, no pulse is asserted in 130.1a, and c is decremented by 1. Note the timing diagram in FIG. 3D is shown for illustrative purposes only, and is not meant to limit the scope of the present disclosure to any particular values for the parameters shown.

One of ordinary skill in the art will appreciate that the techniques of the present disclosure may be readily utilized in applications other than providing a sleep mode clock signal. For example, the decimator output signal may also be used as a clock signal for a real-time clock application. In such an application, a real-time clock utilizing the low-power clock signal according to the present disclosure may continuously keep track of a total amount of time elapsed since an initial event, e.g., manufacture of a device at a factory. Such alternative exemplary embodiments are contemplated to be within the scope of the present disclosure.

Figure 4:
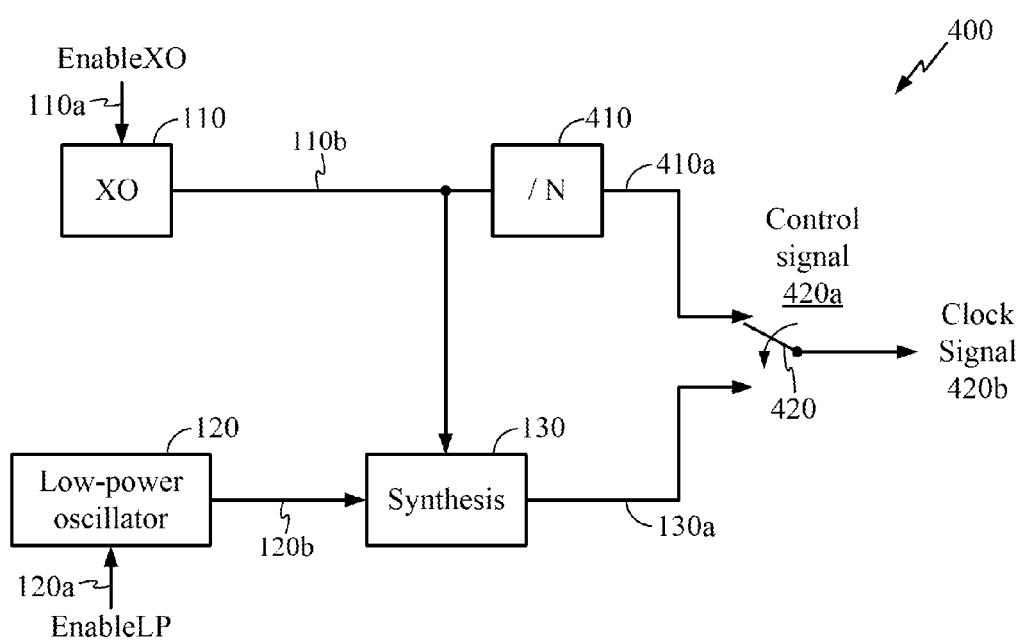
FIG. 4 illustrates an exemplary embodiment of a system for generating a clock signal based on a control signal according to the present disclosure.

FIG. 4 illustrates an exemplary embodiment 400 of a system for generating a clock signal 420b based on a control signal according to the present disclosure. In FIG. 4, a crystal oscillator 110 and a low-power oscillator 120 are coupled to a synthesis module 130 as earlier described herein with reference to FIG. 2. The synthesis module 130 generates a synthesized signal 130a. The crystal oscillator 110 is further coupled to an N divider 410, which divides the frequency of the reference signal 110b to generate a divided reference signal 410a. A switch 420 controlled by a control signal 420a selects between the synthesized signal 130a and the divided reference signal 410a to generate a clock signal 420b. In an exemplary embodiment, the control signal 420a is configured depending on whether a device to be driven by the clock signal 420b is in a normal or a sleep mode. In an alternative exemplary embodiment, the control signal 420a is configured depending on whether a high temperature differential event has been detected.

Figure 4A:
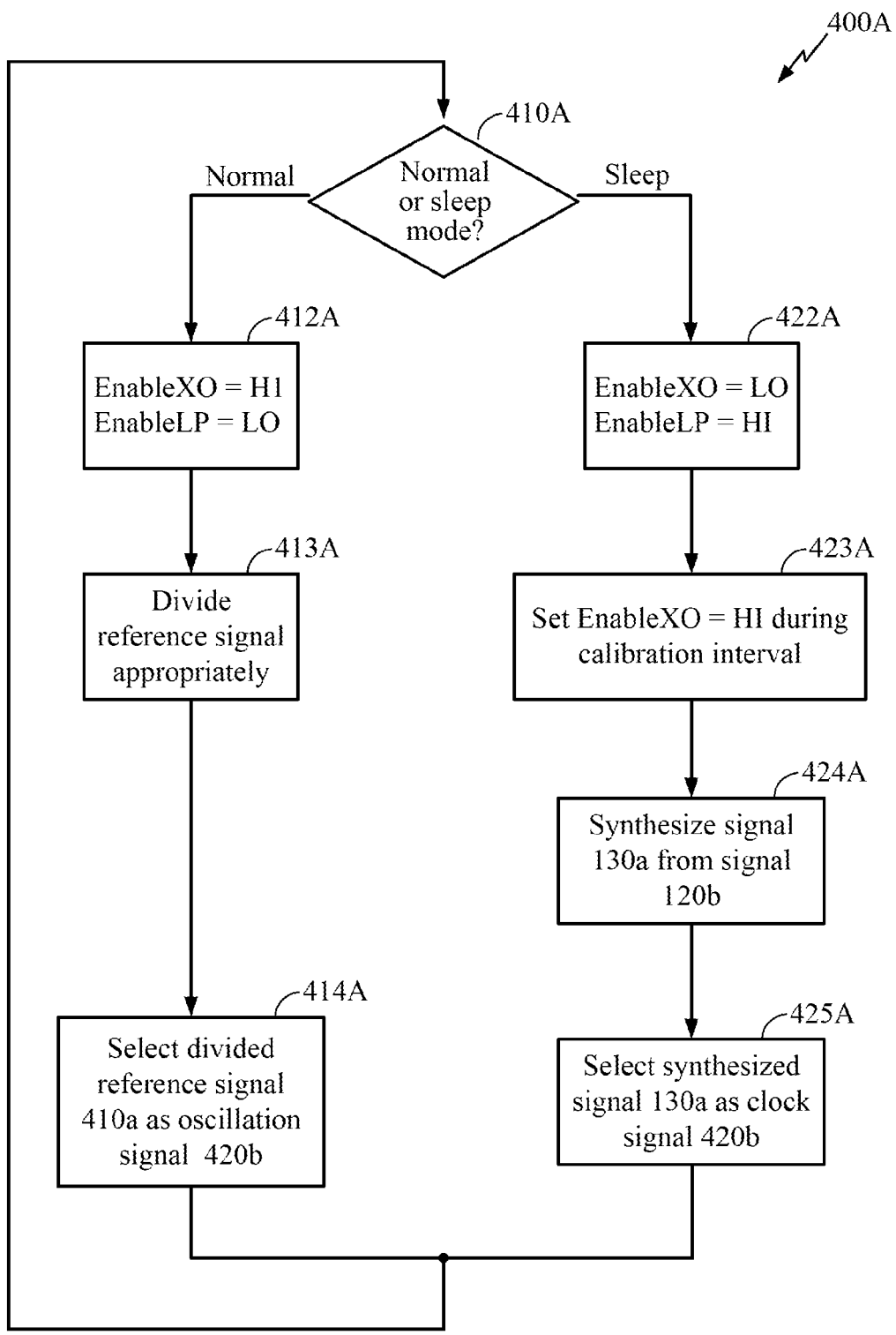
FIG. 4A illustrates an exemplary embodiment of a method performed by the system in normal and sleep modes.

FIG. 4A illustrates an exemplary embodiment of a method 400A performed by the system 400 to accommodate normal and sleep modes. One of ordinary skill in the art will appreciate that the method 400A may be readily modified to accommodate other configurations of the control signal 420a, e.g., depending on whether a high temperature differential event has been detected, etc. Such alternative exemplary embodiments are contemplated to be within the scope of the present disclosure.

At block 410A, it is determined whether a device is in a normal or a sleep mode. If in a normal mode, operation proceeds to block 412A. If in a sleep mode, operation proceeds to block 422A.

At block 412A, the signal EnableXO is set HI to turn on the crystal oscillator 110, while the signal EnableLP is set LO to turn off the low-power oscillator 120.

At block 413A, the reference signal is divided appropriately for the application, e.g., by N divider 410 in FIG. 4, to generate the divided reference signal 410a.

At block 414A, the divided reference signal 410a is selected as the clock signal 420b. In the exemplary embodiment shown in FIG. 4, such selection may be performed by appropriately setting the switch 420 using control signal 420a.

At block 422A, the signal EnableXO is set LO to turn off the crystal oscillator 110, while the signal EnableLP is set HI to turn on the low-power oscillator 120.

At block 423A, EnableXO is set HI only during calibration of the synthesis module 130. In an exemplary embodiment, the intervals chosen for calibration may be as described hereinbelow with reference to FIG. 4B.

At block 424A, the signal 130a may be synthesized from the oscillation signal 120b, e.g., using a synthesis module 130 as previously described hereinabove.

At block 425A, the synthesized signal 130a is selected as the clock signal 420b. As earlier described, such selection may be performed by appropriately setting the switch 420 using the control signal 420a.

Figure 4B:
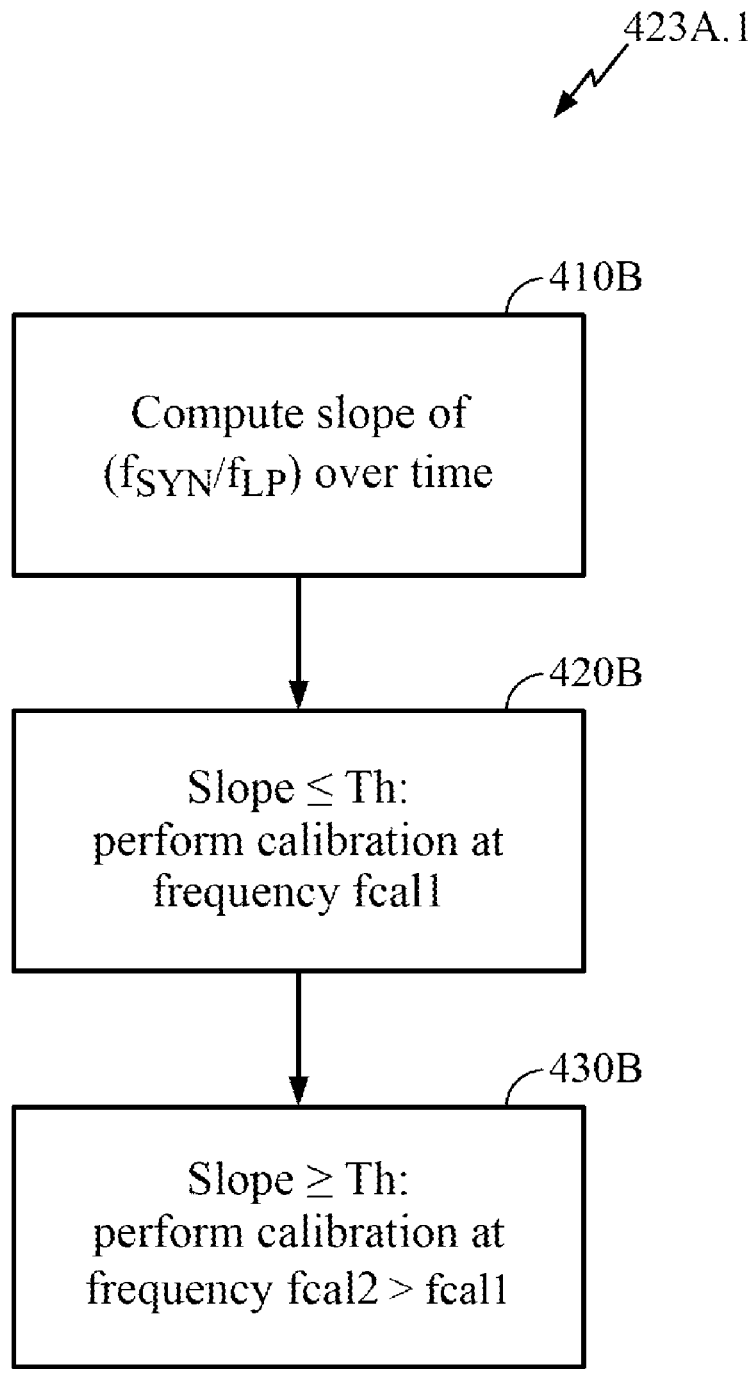
FIG. 4B illustrates an exemplary embodiment of operations that may be performed at block 423A in FIG. 4A.

FIG. 4B illustrates an exemplary embodiment 423A.1 of operations that may be performed at block 423A in FIG. 4A. Note the exemplary embodiment 423A.1 is shown for illustrative purposes only, and is not meant to limit the scope of the present disclosure to any particular scheme for calibration shown.

In FIG. 4B, at block 410B, the slope of $(f_{SYN}/f_{LP})$ over time is computed. In an exemplary embodiment, the slope may be computed by taking the difference between the two most recent computed values of $(f_{SYN}/f_{LP})$, and dividing the difference by the time interval elapsing between the two most recent computations.

At block 420B, the computed slope is compared with a threshold Th. If the slope is less than or equal to Th, then calibration of $(f_{SYN}/f_{LP})$ may be performed at a first calibration frequency fcal1.

At block 430B, if the slope is greater than Th, then calibration may be performed at a second calibration frequency fcal2 greater than the first calibration frequency fcal1.

It will be appreciated that greater slope measured for $(f_{SYN}/f_{LP})$ may generally correspond to a greater rate of change in the frequency $f_{LP}$ of the oscillation signal 120b, which thus requires more frequent calibration to maintain the frequency accuracy of the synthesized signal 130a.

Note the exemplary embodiment 423A.1 is shown for illustrative purposes only, and is not meant to limit the scope of the present disclosure. For example, in alternative exemplary embodiments, the computed slope may be compared with a plurality of thresholds to select from one of a plurality of calibration frequencies. Furthermore, thresholds may be made programmable, e.g., via a serial-bus interface (SBI) for flexibility. Such alternative exemplary embodiments are contemplated to be within the scope of the present disclosure.

In an exemplary embodiment (not shown), if the computed slope is greater than a maximum threshold Th_max, the crystal oscillator 110 may be continuously turned on for a period of time and the clock signal 420b may be derived from the reference signal 110b, e.g., as per normal operation at blocks 412A-414A in FIG. 4A. Such alternative exemplary embodiments are contemplated to be within the scope of the present disclosure.

Figure 5:
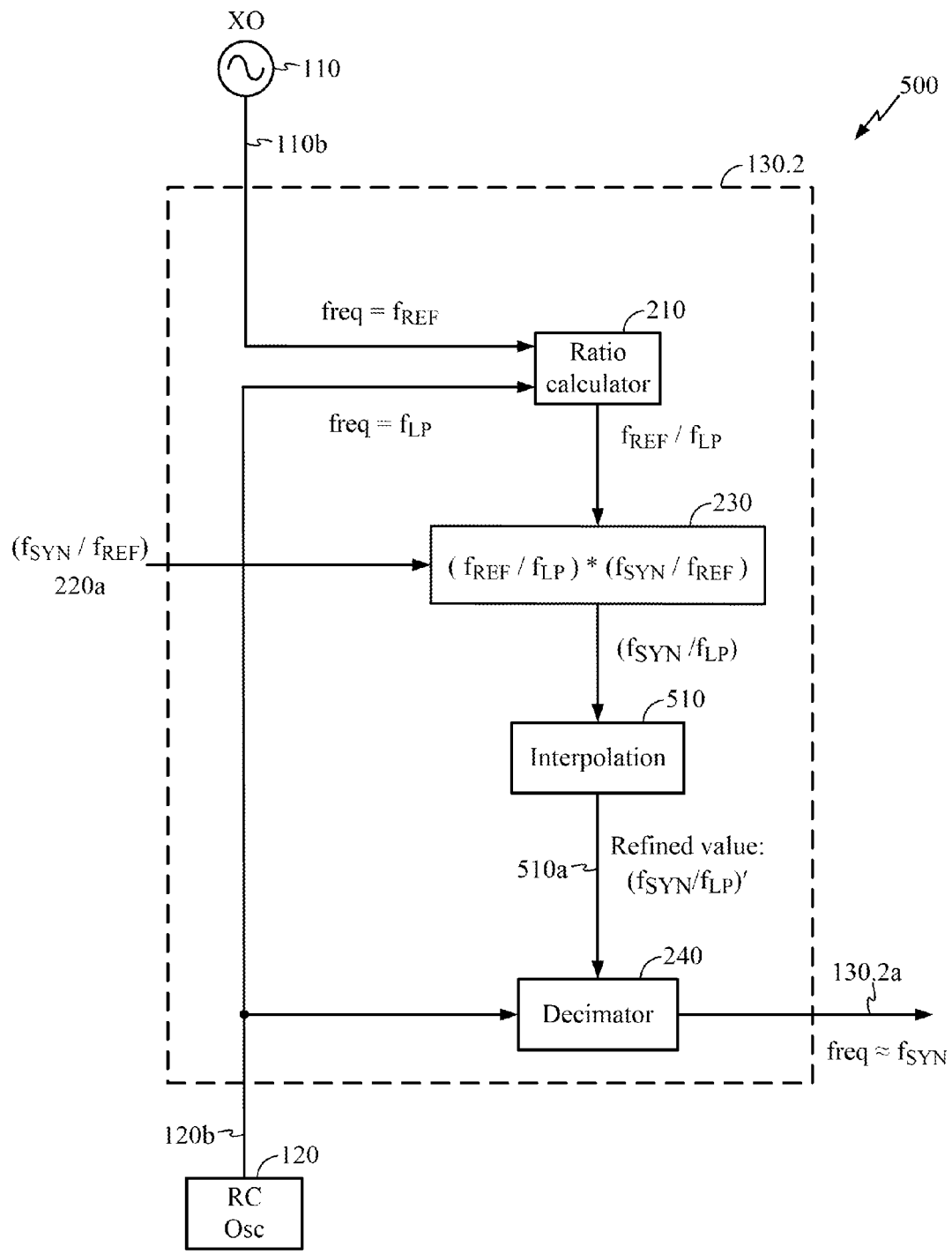
FIG. 5 illustrates an alternative exemplary embodiment of the synthesis module in a system for generating a synthesized signal according to the present disclosure.

FIG. 5 illustrates an alternative exemplary embodiment 130.2 of the synthesis module 130 in a system 500 for generating a synthesized signal 130.2a according to the present disclosure. Note similarly labeled blocks in FIGS. 2 and 5 may perform similar functions, unless otherwise noted.

In FIG. 5, an interpolation block 510 is provided between the synthesis ratio calculator 230 and the decimator 240. The interpolation block 510 accepts the value of $(f_{SYN}/f_{LP})$ computed by the ratio calculator 210, and outputs a refined value $(f_{SYN}/f_{LP})'$ 510a for the computed ratio $(f_{SYN}/f_{LP})$. In an exemplary embodiment, the refined value $(f_{SYN}/f_{LP})'$ 510a may be calculated based on, e.g., knowledge of the frequency offset of the oscillation signal 120b as a function of temperature. For example, such knowledge may be based on a general frequency-versus-temperature characteristic (e.g., an "F-T curve") for the low-power oscillator 120 combined with laboratory measurements performed on a sample device to determine specific operating coefficients for the device.

Figure 5A:
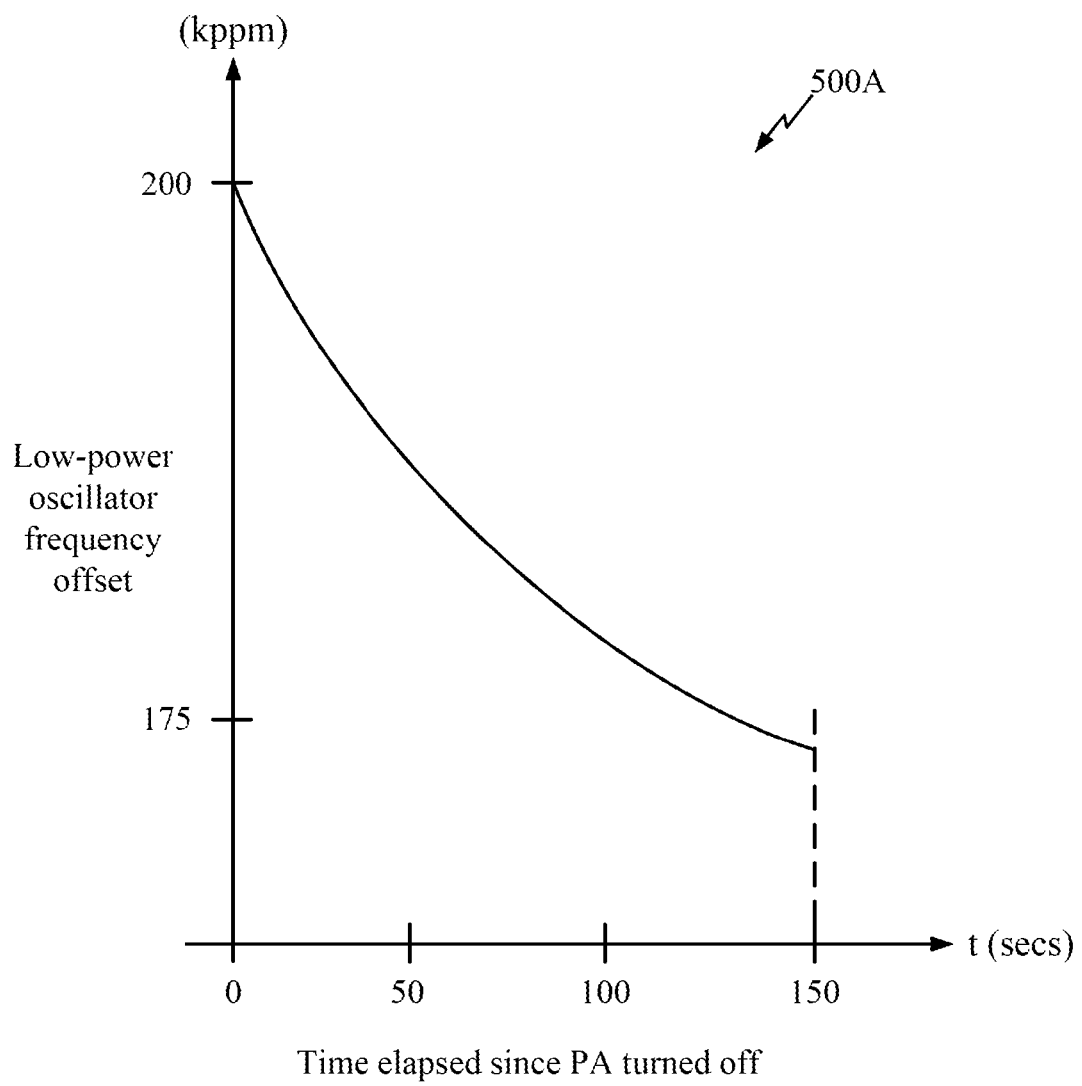
FIG. 5A illustrates an exemplary plot showing an expected offset in the frequency of the oscillation signal versus time elapsed since a PA was turned off.

In alternative exemplary embodiments, such refinement may be further based on tracking an amount of time elapsed since a high temperature differential event in the device, e.g., turning on or off a power amplifier (PA). FIG. 5A illustrates an exemplary plot 500A showing an expected offset in the frequency of the oscillation signal 120b versus time elapsed since a PA was turned off. The plot 500A may be obtained based on, e.g., laboratory measurement of sample devices. According to a plot such as 500A, one of ordinary skill in the art may readily derive techniques generating a refined value $(f_{SYN}/f_{LP})'$ for the computed ratio $(f_{SYN}/f_{LP})$.

In an exemplary embodiment, based on a plot such as 500A, a linear interpolation technique may be used to generate a refined value $(f_{SYN}/f_{LP})'$ based on a most recently calibrated value of $f_{SYN}/f_{LP}$, a time Δt elapsed since the most recent calibration, and a slope m as suitably determined from a plot such as 500A. For example, $(f_{SYN}/f_{LP})'$ may be computed as $(f_{SYN}/f_{LP})'=f_{SYN}/f_{LP}+m*\Delta t$. It will be appreciated that the slope m may be chosen to linearly approximate the behavior of $(f_{SYN}/f_{LP})$ over the relevant time interval, as derived from a plot such as 500A. One of ordinary skill in the art may further derive other interpolation techniques, e.g., using second-order and/or higher-order functions of Δt, to generate the refined value $(f_{SYN}/f_{LP})'$. Furthermore, such interpolation techniques may be combined with the slope-based estimation techniques described with reference to FIG. 4B. Such alternative exemplary embodiments are contemplated to be within the scope of the present disclosure.

Figure 6A:
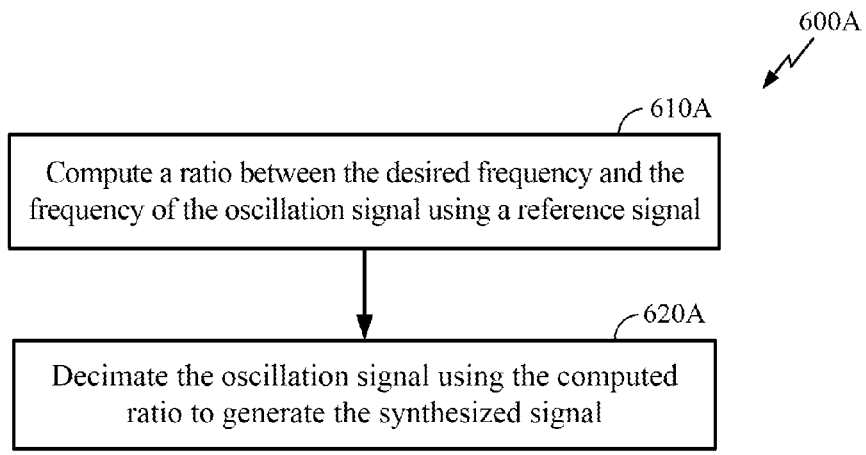
FIG. 6A illustrates an exemplary embodiment of a method according to the present disclosure.

FIG. 6A illustrates an exemplary embodiment 600A of a method according to the present disclosure. The method 600A is for synthesizing a signal having a desired frequency from an oscillation signal.

In FIG. 6A, at block 610A, the method computes a ratio between the desired frequency and the frequency of the oscillation signal using a reference signal. The reference signal may have a known frequency, and the frequency of the oscillation signal may be greater than the desired frequency.

At block 620A, the method may decimate the oscillation signal based on the computed ratio to generate the synthesized signal.

Figure 6B:
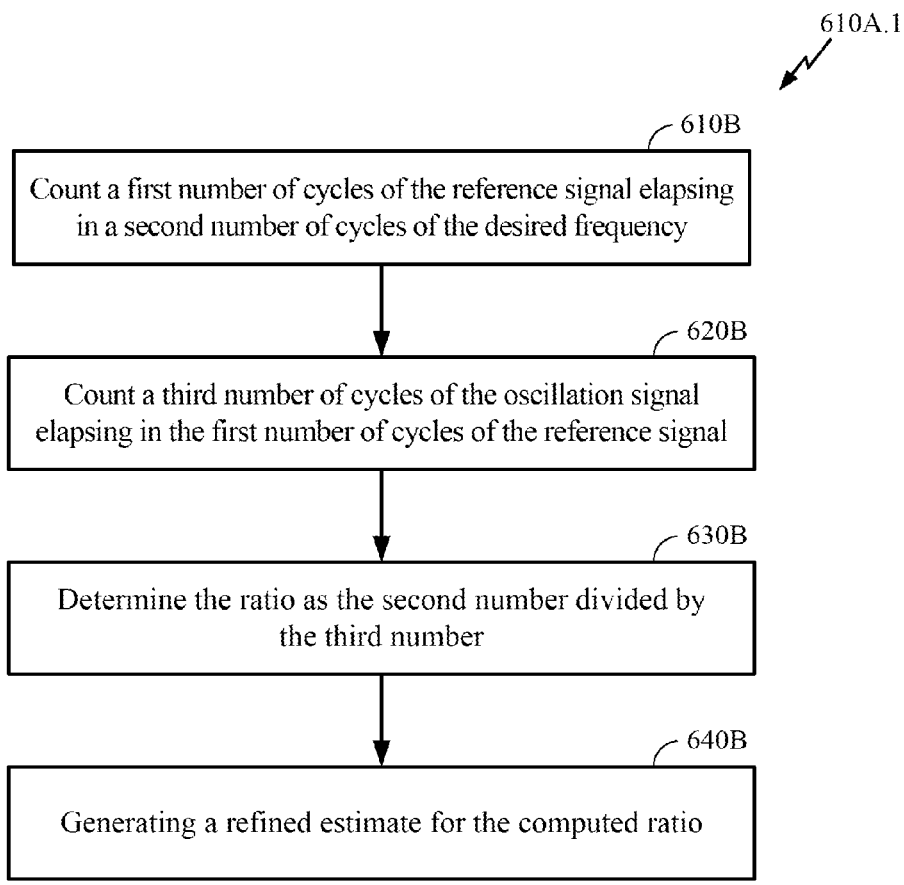
FIG. 6B illustrates an exemplary embodiment of block 610A of FIG. 6A.

FIG. 6B illustrates an exemplary embodiment 610A.1 of block 610A of FIG. 6A.

In FIG. 6B, at block 610B, a first number of cycles of the reference signal elapsing in a second number of cycles of the desired frequency is counted.

At block 620B, a third number of cycles of the oscillation signal elapsing in the first number of cycles of the reference signal is counted.

At block 630B, the ratio is determined as the second number divided by the third number.

At block 640B, a refined estimate is generated for the computed ratio.

Figure 7:
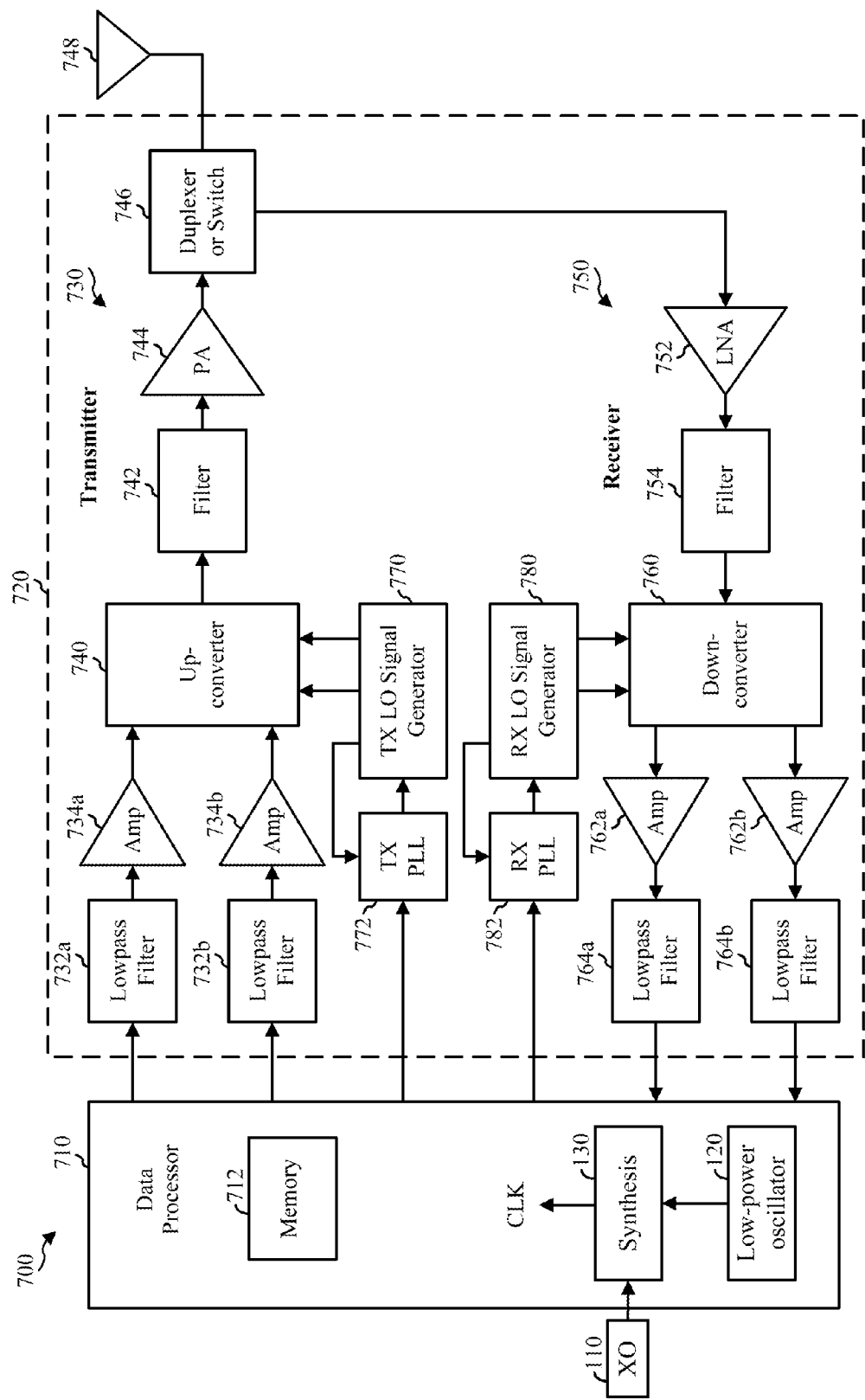
FIG. 7 illustrates a block diagram of a design of a wireless communication device in which the techniques of the present disclosure may be implemented.

FIG. 7 illustrates a block diagram of a design of a wireless communication device 700 in which the techniques of the present disclosure may be implemented. FIG. 7 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 7. Furthermore, other circuit blocks not shown in FIG. 7 may also be used to condition the signals in the transmitter and receiver. Some circuit blocks in FIG. 7 may also be omitted.

In the design shown in FIG. 7, wireless device 700 includes a transceiver 720 and a data processor 710 having a memory 712 to store data and program codes. Transceiver 720 includes a transmitter 730 and a receiver 750 that support bi-directional communication. In general, wireless device 700 may include any number of transmitters and any number of receivers for any number of communication systems and frequency bands. All or a portion of transceiver 720 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 7, transmitter 730 and receiver 750 are implemented with the direct-conversion architecture.

In the transmit path, data processor 710 processes data to be transmitted and provides I and Q analog output signals to transmitter 730. Within transmitter 730, lowpass filters 732a and 732b filter the I and Q analog output signals, respectively, to remove undesired images caused by the prior digital-to-analog conversion. Amplifiers (Amp) 734a and 734b amplify the signals from lowpass filters 732a and 732b, respectively, and provide I and Q baseband signals. An upconverter 740 upconverts the I and Q baseband signals with I and Q transmit (TX) local oscillating (LO) signals from a TX LO signal generator 770 and provides an upconverted signal. A filter 742 filters the upconverted signal to remove undesired images caused by the frequency upconversion as well as noise in a receive frequency band. A power amplifier (PA) 744 amplifies the signal from filter 742 to obtain the desired output power level and provides a transmit RF signal. The transmit RF signal is routed through a duplexer or switch 746 and transmitted via an antenna 748.

In the receive path, antenna 748 receives signals transmitted by base stations and provides a received RF signal, which is routed through duplexer or switch 746 and provided to a low noise amplifier (LNA) 752. The received RF signal is amplified by LNA 752 and filtered by a filter 754 to obtain a desirable RF input signal. A downconverter 760 downconverts the RF input signal with I and Q receive (RX) LO signals from an RX LO signal generator 780 and provides I and Q baseband signals. The I and Q baseband signals are amplified by amplifiers 762a and 762b and further filtered by lowpass filters 764a and 764b to obtain I and Q analog input signals, which are provided to data processor 710.

TX LO signal generator 770 generates the I and Q TX LO signals used for frequency upconversion. RX LO signal generator 780 generates the I and Q RX LO signals used for frequency downconversion. Each LO signal is a periodic signal with a particular fundamental frequency. A PLL 772 receives timing information from data processor 710 and generates a control signal used to adjust the frequency and/or phase of the TX LO signals from LO signal generator 770. Similarly, a PLL 782 receives timing information from data processor 710 and generates a control signal used to adjust the frequency and/or phase of the RX LO signals from LO signal generator 780.

As shown in FIG. 7, the data processor 710 may be supplied with a reference signal generated by a crystal oscillator (XO) 110 as earlier described herein with reference to FIG. 1. For example, the reference signal may have a fixed frequency that may be used by the data processor 710 as a frequency/timing reference, e.g., to drive the rest of the communication device 700. The reference signal may be provided to a synthesis module 130 provided on the data processor 710, which may synthesize a clock signal (CLK) from the oscillation signal of a low-power oscillator 120 according to the present disclosure. The CLK signal may be used, e.g., as a clock reference during operation in a sleep mode of the device 700.

In the exemplary embodiment shown, instances of the low-power oscillator 120 and the synthesis module 130 are directly provided on the data processor 710. In an exemplary embodiment, the low-power oscillator 120 may be integrated on a single integrated circuit (IC) with the data processor 710 and the transceiver 720. In alternative exemplary embodiments, the modules may be alternatively partitioned from the configuration shown.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for synthesizing a signal having a desired frequency from an oscillation signal, the method comprising:
   computing a ratio between the desired frequency and the frequency of the oscillation signal using a reference signal, the reference signal having a known frequency, the frequency of the oscillation signal being greater than the desired frequency; and
   decimating the oscillation signal according to the computed ratio to generate the synthesized signal, the decimating the oscillation signal comprising:
   at each cycle of the oscillation signal, incrementing a counter;
   generating a pulse when the counter value is equal to or greater than 1; and
   decrementing the counter value by 1 when the counter value is equal to or greater than 1.

2. The method of claim 1, wherein:
   the incrementing the counter includes incrementing the counter by the value of the computed ratio.

3. The method of claim 1, wherein:
   the incrementing the counter includes incrementing the counter by one minus the value of the computed ratio.

4. The method of claim 1, the computing the ratio comprising:
   counting a first number of cycles of the reference signal elapsing in a second number of cycles of the desired frequency;
   counting a third number of cycles of the oscillation signal elapsing in the first number of cycles of the reference signal; and
   dividing the second number by the third number to generate the ratio.

5. The method of claim 4, the second number equal to one.

6. The method of claim 1, the computing the ratio comprising:
   counting a first number of cycles of the reference signal elapsing in one cycle of the oscillation cycle; and
   multiplying the first number by the ratio between the desired frequency and the frequency of the reference signal.

7. The method of claim 1, the computing the ratio comprising periodically computing the ratio at a first calibration frequency.

8. The method of claim 1, further comprising turning off the reference signal when not performing the computing the ratio.

9. The method of claim 1, further comprising:
   computing the slope of the ratio over time;
   if the computed slope is less than a threshold, periodically computing the ratio according to a first calibration frequency;
   if the computed slope is greater than the threshold, periodically computing the ratio according to a second calibration frequency higher than the first calibration frequency.

10. The method of claim 1, further comprising:
computing the slope of the ratio over time; and
selecting a calibration frequency for periodically computing the ratio depending on the computed slope.

11. The method of claim 1, further comprising:
computing the slope of the ratio over time;
if the computed ratio exceeds a maximum threshold, synthesizing the signal from the reference signal.

12. The method of claim 1, the reference signal comprising the output signal of a crystal oscillator, the oscillation signal comprising the output signal of an RC oscillator provided on an integrated circuit.

13. The method of claim 1, further comprising selecting between synthesizing the signal from the reference signal and synthesizing the signal from the decimated oscillation signal based on a control signal.

14. The method of claim 13, the control signal based on whether the device is operating in a normal mode or a sleep mode.

15. The method of claim 13, further comprising synthesizing the signal from the reference signal based on the control signal indicating a high temperature differential event.

16. The method of claim 13, further comprising disabling a crystal oscillator generating the reference signal when the synthesizing the signal from the decimated oscillation signal is selected, the method further comprising periodically enabling the crystal oscillator to compute the ratio.

17. The method of claim 1, further comprising:
generating a refined estimate of the computed ratio, the refined estimate based on a frequency versus temperature dependence of the oscillation signal; the decimating the oscillation signal being based on the refined estimate of the computed ratio.

18. The method of claim 1, further comprising:
generating a refined estimate for the computed ratio, the refined estimate based on an amount of time elapsed since a high temperature differential event; the decimating the oscillation signal based on the refined estimate.

19. The method of claim 18, the generating the refined estimate comprising multiplying the amount of time elapsed with a slope to generate a first-order term, and adding the first-order term to a most recently computed value of the ratio between the desired frequency and the frequency of the oscillation signal.

20. The method of claim 18, the high temperature differential event comprising a power amplifier being turned on or off.

21. An apparatus for synthesizing a signal having a desired frequency from an oscillation signal, the apparatus comprising:
a ratio calculator for computing a ratio between the desired frequency and the frequency of the oscillation signal using a reference signal, the reference signal having a known frequency, the frequency of the oscillation signal being greater than the desired frequency; and
a decimator for decimating the oscillation signal according to the computed ratio to generate the synthesized signal; the decimator operative to:
increment a counter at each cycle of the oscillation signal;
generate a pulse when the counter value is equal to or greater than 1; and
decrement the counter value by 1 when the counter value is equal to or greater than 1.

22. The apparatus of claim 21, the decimator configured to:
at each cycle of the oscillation signal, increment a counter by the value of the computed ratio;
generate a pulse when the counter value is equal to or greater than 1; and
decrement the counter value by 1 when the counter value is equal to or greater than 1.

23. The apparatus of claim 21, the ratio calculator configured to:
count a first number of cycles of the reference signal elapsing in one cycle of the oscillation cycle; and
multiply the first number by the ratio between the desired frequency and the frequency of the reference signal.

24. The apparatus of claim 21, the ratio calculator further configured to periodically compute the ratio at a first calibration frequency.

25. The apparatus of claim 21, the ratio calculator further configured to:
compute the slope of the ratio over time;
if the computed slope is less than a threshold, periodically compute the ratio according to a first calibration frequency;
if the computed slope is greater than the threshold, periodically compute the ratio according to a second calibration frequency higher than the first calibration frequency.

26. The apparatus of claim 21, the ratio calculator further configured to:
compute the slope of the ratio over time; and
select a calibration frequency for periodically computing the ratio depending on the computed slope.

27. The apparatus of claim 21, the ratio calculator further configured to:
compute the slope of the ratio over time;
if the computed ratio exceeds a maximum threshold, synthesize the signal from the reference signal.

28. The apparatus of claim 21, the reference signal comprising the output signal of a crystal oscillator, the oscillation signal comprising the output signal of an RC oscillator provided on an integrated circuit.

29. The apparatus of claim 21, further comprising a switch for selecting between synthesizing the signal from the reference signal and synthesizing the signal from the decimated oscillation signal based on a control signal.

30. The apparatus of claim 29, the control signal based on whether the device is operating in a normal mode or a sleep mode.

31. The apparatus of claim 29, the apparatus further configured to synthesize the signal from the reference signal based on the control signal indicating a high temperature differential event.

32. The apparatus of claim 29, the apparatus further configured to disable a crystal oscillator generating the reference signal when the decimated oscillation signal is selected, the apparatus further configured to periodically enable the crystal oscillator to compute the ratio.

33. The apparatus of claim 22, further comprising:
an interpolation block configured to generate a refined estimate of the computed ratio, the refined estimate based on a frequency versus temperature dependence of the oscillation signal; the decimator configured to decimate the oscillation signal being based on the refined estimate of the computed ratio.

34. The apparatus of claim 22, further comprising:
an interpolation block configured to generate a refined estimate for the computed ratio, the refined estimate based on an amount of time elapsed since a high temperature differential event; the decimator configured to decimate the oscillation signal based on the refined estimate.

35. The apparatus of claim 34, the interpolation block further configured to generate the refined estimate comprising multiplying the amount of time elapsed with a slope to generate a first-order term, and add the first-order term to a most recently computed value of the ratio between the desired frequency and the frequency of the oscillation signal.

36. The apparatus of claim 34, the high temperature differential event comprising a power amplifier being turned on or off.

37. An apparatus for synthesizing a signal having a desired frequency from an oscillation signal, the apparatus comprising:
- means for computing a ratio between the desired frequency and the frequency of the oscillation signal; and
- means for decimating the oscillation signal according to the computed ratio to generate the synthesized signal, the means for decimating the oscillation signal comprising:
- at each of the oscillation signal, incrementing a counter;
- generating a pulse when the counter value is equal to or greater than 1; and
- decrementing the counter value by 1 when the counter value is equal to or greater than 1.

38. A non-transitory computer program product storing code for causing a computer to synthesize a signal having a desired frequency from an oscillation signal, the code comprising:
- code for causing a computer to compute a ratio between the desired frequency and the frequency of the oscillation signal using a reference signal, the reference signal having a known frequency, the frequency of the oscillation signal being greater than the desired frequency; and
- code for causing a computer to decimate the oscillation signal according to the computed ratio to generate the synthesized signal, the code for causing the computer to decimate the oscillation signal comprising:
- code for incrementing a counter at each cycle of the oscillation signal;
- code for generating a pulse when the counter value is equal to or greater than 1; and
- code for decrementing the counter value by 1 when the counter value is equal to or greater than 1.

* * * * *